(12) United States Patent
Nuggehalli et al.

(10) Patent No.: US 7,217,592 B2
(45) Date of Patent: May 15, 2007

(54) METHOD OF MAGNETIC FIELD ASSISTED SELF-ASSEMBLY

(75) Inventors: Ravindra M. Nuggehalli, Summit, NJ (US); Anthony T. Fiory, Summit, NJ (US); Shet Sudhakar, Newark, NJ (US)

(73) Assignee: New Jersey Institute of Technology, Newark, NJ (US)

( * ) Notice: Subject to any disclaimer, the term of this patent is extended or adjusted under 35 U.S.C. 154(b) by 0 days.

(21) Appl. No.: 11/077,961

(22) Filed: Mar. 11, 2005

(65) Prior Publication Data

US 2005/0250229 A1    Nov. 10, 2005

Related U.S. Application Data

(60) Provisional application No. 60/552,646, filed on Mar. 12, 2004.

(51) Int. Cl.
*H01L 21/44* (2006.01)
(52) U.S. Cl. ............... 438/107; 438/110; 438/120
(58) Field of Classification Search ......... 438/106–122
See application file for complete search history.

(56) References Cited

U.S. PATENT DOCUMENTS 5,962,975 A    10/1999    Lepselter 6,888,178 B2 *  5/2005   Fonstad et al. ............. 257/190
2003/0182794 A1  10/2003  Fonstad, Jr. et al.
2005/0009303 A1 *  1/2005  Schatz ........................ 438/466

OTHER PUBLICATIONS

Sudhakar Shet et al., The Magnetic Field-Assisted Assembly of Nanoscale Semiconcudtor Devices: A New Technique, JOM, Oct. 2004, 32-34.

* cited by examiner

*Primary Examiner*—H. Jey Tsai
(74) *Attorney, Agent, or Firm*—Klauber & Jackson LLC

(57) ABSTRACT

A method for assembling and integrating microstructures (pills) onto a substrate. A plurality of patterned recesses are formed on the substrates, the recesses having transverse cross-sections and openings of specific shapes. A hard magnetic layer is deposited at the bottom of each said recess. A guide is positioned over the substrate, the guide having patterned hole shapes matching the shapes of the openings to the patterned recesses with which the holes mate. A collection of the pills is placed atop the guide. The said collection includes members with cross-sections matching the shapes of the openings to the recesses, and each pill is coated at one end with a soft magnetic layer. A moving magnetic field is applied to the collection of pills to agitate the pills, and effect a magnetic attraction between the layers at the ends of the pills and the soft magnetic layer at the bottom of the recesses. The pills fall through the similarly shaped guide holes and into the recesses and are firmly attracted to the bottoms of the recesses by the magnetic attractive forces.

10 Claims, 8 Drawing Sheets

METHOD OF MAGNETIC FIELD ASSISTED SELF-ASSEMBLY

RELATED APPLICATION

This application claims priority from U.S. Provisional Patent Applications Ser. No. 60/552,646, filed Mar. 12, 2004.

FIELD OF INVENTION

This invention relates generally to the manufacture of integrated electronic circuits, and more specifically relates to integration of microstructures onto a substrate.

BACKGROUND OF INVENTION

Heterogeneous integration of high performance electrical, micro-electro-mechanical, and optoelectronic devices together onto the same substrate is very important for the development of low-cost and/or high-performance/density Microsystems.

Integrating different materials and different device functions is widely recognized because of its wide applications in the market. But there are inherent problems in combining different materials. Amongst those problems, are differences in thermal expansion coefficient between different materials. For example, the thermal expansion mismatch is very large between silicon, the primary material of interest for large-scale high-density integrated circuits, and III–V compounds, the materials of interest for optoelectronic and microwave devices and circuits.

The current microengineering tool kit is capable of producing a great range of sensor and actuator devices. This set of fabrication method consists mainly of bulk and surface silicon micromachining, laser micro-machining, and LIGA (German acronym for Lithographic Galvanoformung Abformung). In the next generation of MEMS, micromechanical sensors and actuators will be integrated with electronic and optical components to give powerful and complex Microsystems. The integration of microelectromechanical systems (MEMS) sensors and actuators with other classes of microcomponents-electronic, optical and electromechanical devices onto a single substrate has the potential to create powerful and complex Microsystems.

As the market for low cost and high performance electronic, optoelectronic, and electromechanical integrated circuits increases, many new assembly and integration techniques must be developed. It has become increasingly important to integrate high performance low cost electronic, optoelectronic and/or radio frequency components onto dissimilar substrates. To improve system performance and reduce assembly cost, often compound semiconductor devices must be integrated monolithically to active circuitry contained in the substrate. Primary interest among these is integrating these types of devices with silicon CMOS (Complementary Metal Oxide Semiconductor) technology, in order to increase the number of on-wafer functions available, and ultimately reduce the cost, size, and weight of micro-device based systems.

Current integration strategies often rely on "pick and place" serial assembly techniques, which encounter speed and cost constraints in applications that require the assembly of large numbers of microscale components with high positioning precision. In addition, surface forces must be carefully controlled to prevent unwanted adhesion of microscopic parts to each other or tool surfaces. Because of these disadvantages new low-cost parallel assembly techniques are being investigated and commercialized.

As the dimensions of micro-electronic, micro-optoelectronic and micro-electromechanical devices and systems decrease, and as their complexity increases, there is a need to use self assembly and integration techniques to simplify the processing of these devices.

Several approaches have been proposed for fabricating and assembling of different micro-devices (or generally microstructures) onto a substrate. Such proposed approaches include, selective area growth, flip-chip bonding, epitaxial lift-off (ELO), electrostatic alignment, and fluidic self-assembly. However, each of these approaches has drawbacks and technological issues, and the serious limitation of these approaches limit their utility in actual applications.

A selective area growth approach was investigated early as a potential method of heterogeneous integration. In this approach one grows GaAs or InP devices directly onto a silicon substrate. This approach becomes limiting due to lattice mismatch and thermal property mismatch between Si and GaAs. The devices grown on silicon are not as good devices as those grown on a lattice-matched substrate. In addition, growing GaAs onto silicon is inherently difficult and therefore very costly. Accordingly, InP or GaAs cannot efficiently be grown on a silicon substrate.

Another approach is the optical solder bump method for heterogeneous integration. The approach of the optical solder bump method is to put compound semiconductor heterostructures in recesses formed in the surface of integrated circuit wafers and then fabricate those heterostructures into devices monolithically integrated with the pre-existing VLSI (Very Large Scale Integration) electronic circuitry. The fully processed active devices are individually placed onto bonding sites with a mechanical pick-and-place tool. The devices are held into place by solder bonding, and then the substrate is removed by using etching, if desired. This approach also has serious limitations. Because this process involves serial manipulation and alignment of individual device, it is expensive and time consuming.

For the most part heterogeneous integration is currently achieved by using some variation of the solder bump process to attach modest size arrays of devices—e.g. in attaching vertical-cavity surface emitting lasers (VCSELs) on individual integrated circuit chips. However, this approach also has major drawbacks. The bonding temperature is very important for the size of the device arrays that can be bonded, and is typically limited to a centimeter on a side. Device array substrates must be thinned and totally removed to separate the device in the array from one another. This involves additional processing. The current industry standard for silicon integrated circuit wafers is 200 mm in diameter, and for GaAs wafers it is 150 mm, because of difference in diameter bonding full wafers is impractical. To overcome this problem, one is forced to bond pieces of wafers and to use a tiling process to cover a full wafer.

Other approaches for heterogeneous integration include epitaxial transfer procedures such as appliqué and ELO. For both processes, an epitaxial layer is generally released from its growth substrate, either by etching the substrate down to an etch-stop layer in appliqué technique or by etching a sacrificial layer in ELO technique. The layer, which is typically supported by a polymer membrane or wax, is then bonded to host substrate through van der Waals bonding or with a metal bond. The devices can be processed either before or after the transfer of the epitaxial layer to the host substrate depending upon the process requirements. However, both appliqué and ELO techniques have disadvantages.

Such disadvantages include that handling extremely thin epitaxial layers is difficult and tedious, and any pre-processed devices need to be aligned to existing circuitry on the host substrate, which is time consuming and difficult when compounded with the thinness of the epitaxial film.

Another approach proposed, wafer bonding, is used to transfer an entire epitaxial layer. In this method, an epitaxial structure is grown upside down on a growth wafer. The host wafer and the growth wafer are bonded together, and the growth wafer is removed to expose the epitaxial layers. The epitaxial layer is then processed to create devices. This method also has major drawbacks, Due to thermal expansion mismatch of the wafers, and due to different thermal budgets for the two different materials, bonded wafers suffer from thermal limitations.

A yet further approach is to begin with individual devices and attach each in its proper position on the integrated circuit surface. At first such an approach sounds impractical, but upon much thought one realizes that it offers significant advantages once the assembly process is perfected. It circumvents the problem of smaller compound semiconductor wafer sizes, it can be used to assemble several different types of devices on a single substrate, and it can be used with any material with minimal concern with thermal expansion coefficient.

For successful, efficient heterogeneous integration, a method that will align separate discrete die without individual manipulation of the devices is required. There have been some approaches that meet these requirements. These approaches include vector potential parts manipulation, DNA and electrophoresis-assisted assembly, and fluidic self-assembly techniques. These techniques each involve the assembling and integration of many individual units on processed integrated circuits (or other electronic substrates). The individual units (or microstructures) may be a single devices, small assemblies of devices, or full integrated circuits.

The vector potential parts manipulation process allows for the alignment of separate device in an assembly. This process most often uses electrostatics, to direct and place units. Units are placed on a vibrating stage and are attracted to potential wells on the substrate. As the vibration is reduced, the units position into place. At present, this method has been used to manipulate relatively large parts using high voltages in a specially prepared alignment fixture.

In the DNA and electrophoresis-assisted assembly technique, a DNA-like polymer film is formed on the individual parts and a complementary film is patterned on the wafer or on the circuit surface where the parts are to be placed. The attraction force between the two complementary DNA films then locates and holds the parts in position. An electrophoresis approach is also used to attract and place device parts on a surface electrode pattern.

In the fluidic self-assembly approach, carefully etched devices are placed in a substrate with etched recesses of matching dimensions. It is one process that will align and place separate devices without individual manipulation. The host substrate is patterned with deep recesses that match the shape of the device. The specially shaped devices are separated from the growth substrate, suspended in a fluid, and flowed over the surface of the host substrate, and gravity is relied upon to get the devices into the recesses and to hold them there. However, fluidic self-assembly requires that the devices are trapezoidally shaped, to match the recesses in the substrate. This shape requirement is difficult to achieve and adds several processing steps, such as ion-milling.

Accordingly, it is one object of the present invention to provide a new technique of assembling and integration of microstructures onto a silicon wafers or on the separate substrate, which is of low cost, very compact, efficient, reliable, and requires minimum maintenance.

It is a further object of the invention to provide a technique of assembling and integration of microstructures onto a substrate that can be carried out in such a manner to avoid damaging the preexisting electronics on the substrate.

It is a yet further object of the invention to provide a new technique of assembling and integration of microstructures onto a substrate that takes full advantages of the very large diameter silicon wafers.

SUMMARY OF INVENTION

Now in accordance with one embodiment of the present invention a substrate having microstructure devices therein is formed by using a wafer with patterned recesses provided within an insulating layer on the wafer. A hard (i.e., magnetized) magnetic layer is formed at the bottom of each patterned recess. A soft (unmagnetized) magnetic guide layer having exact patterned holes matching the openings to the patterned recesses is aligned on top of the recess bearing substrate. A plurality of microstructure devices is prepared, and these devices (or "pills") each have a soft magnetic layer at the bottom thereof. The device pills are placed on the surface of the soft magnetic guide layer and a magnetic field is applied so that individual device pills can fall through the holes in the soft magnetic guide layer into the underlying substrate recesses and be retained therein due to the strong short-range magnetic attractive force between the hard magnetic layer in the recesses and the soft magnetic layer at the bottom of each device pill. Further embodiments of the invention are described below.

DESCRIPTION OF DRAWINGS

In the drawings appended hereto:

FIGS. 1(a) to 1(l) schematically illustrate the sequence of steps that may be used in the invention.

DESCRIPTION OF PREFERRED EMBODIMENTS

Figure 1:
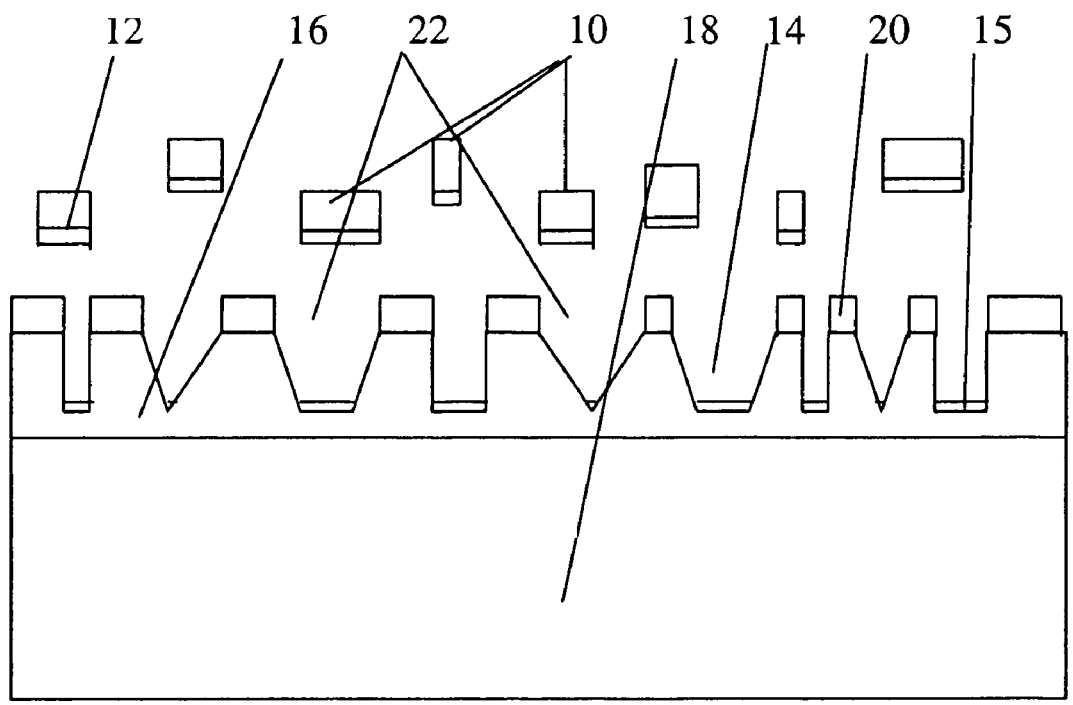
FIG. 1 is an overall schematic cross-sectional view showing a magnetic self-assembly process in accordance with the invention.
Figure 1:
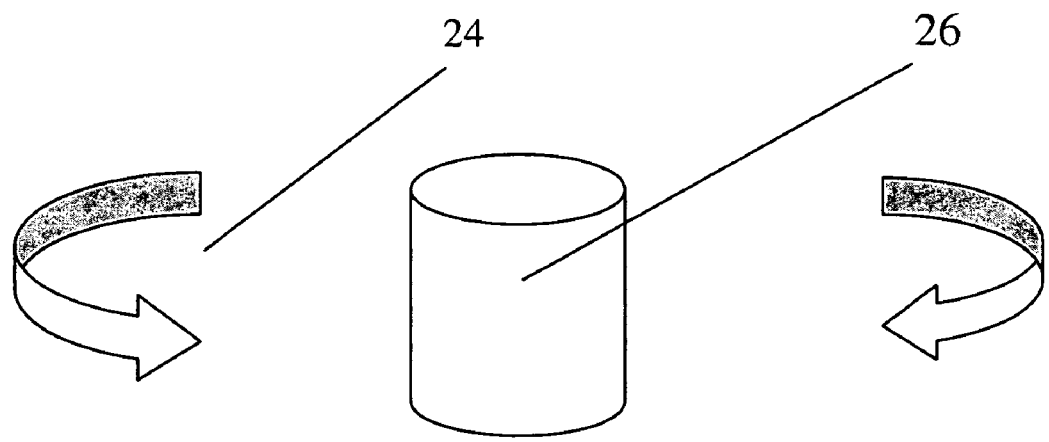
Figure 1:
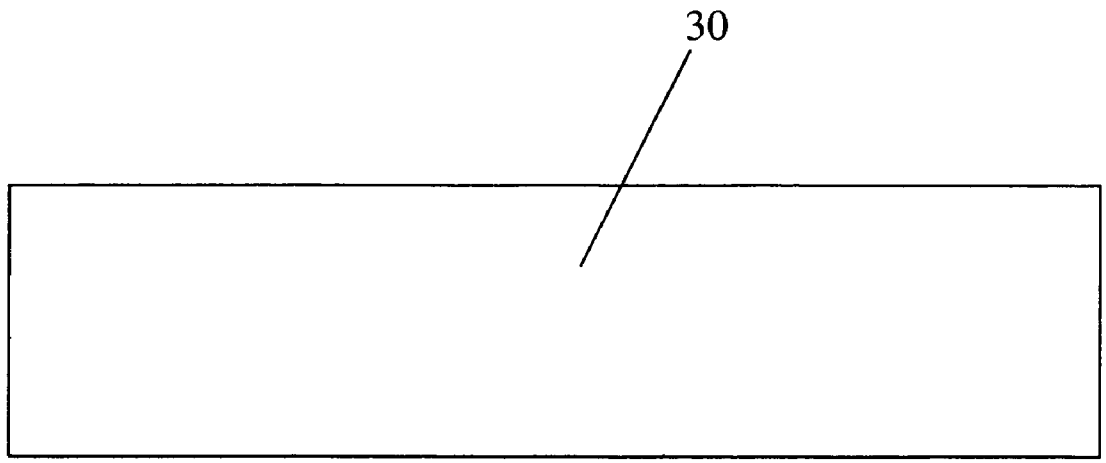
Figure 1:
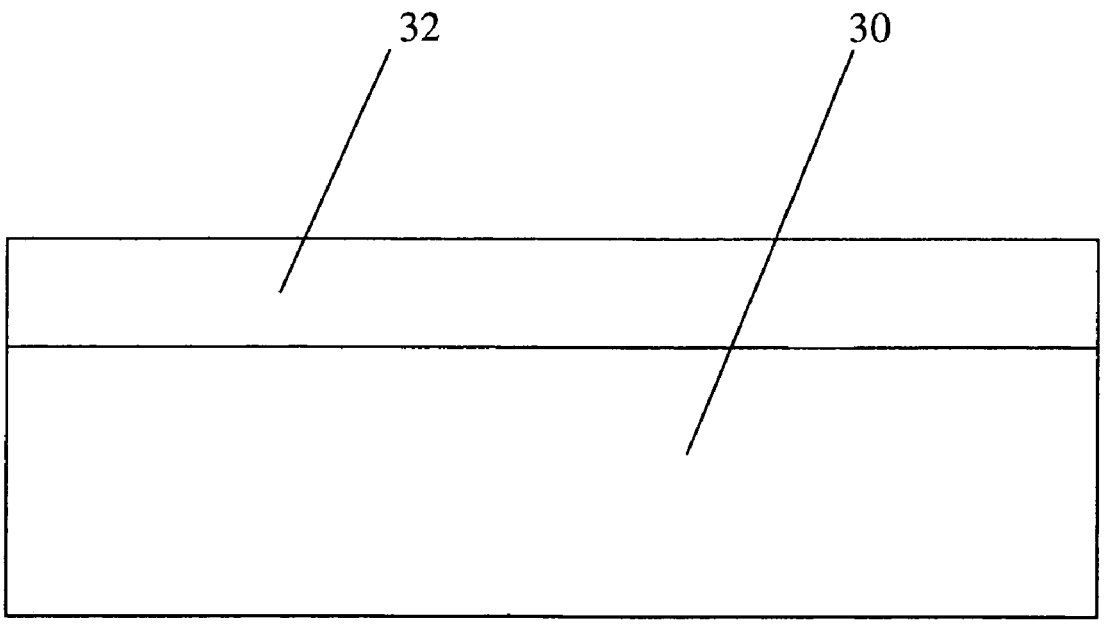
Figure 1:
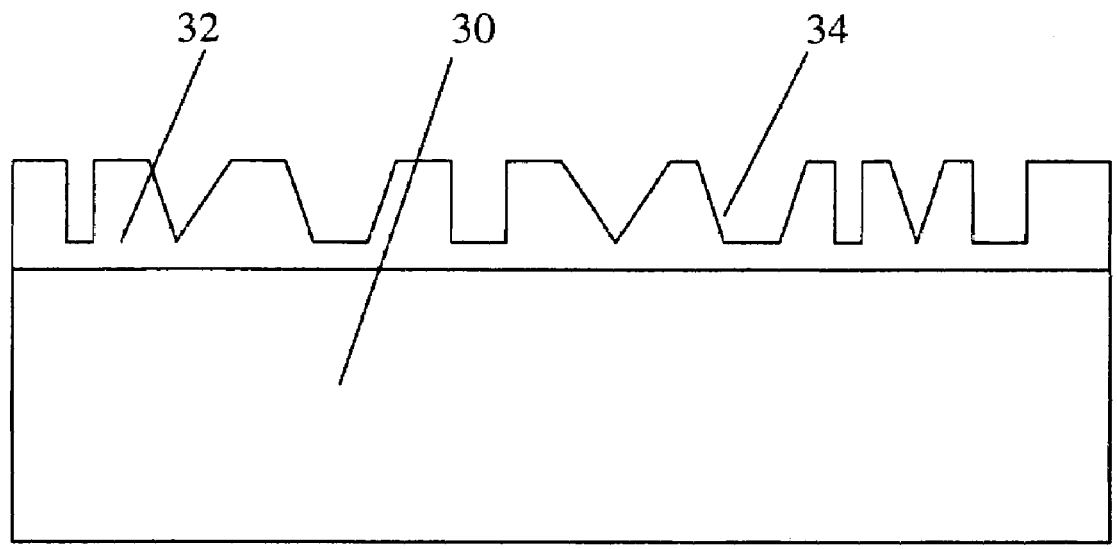
Figure 1:
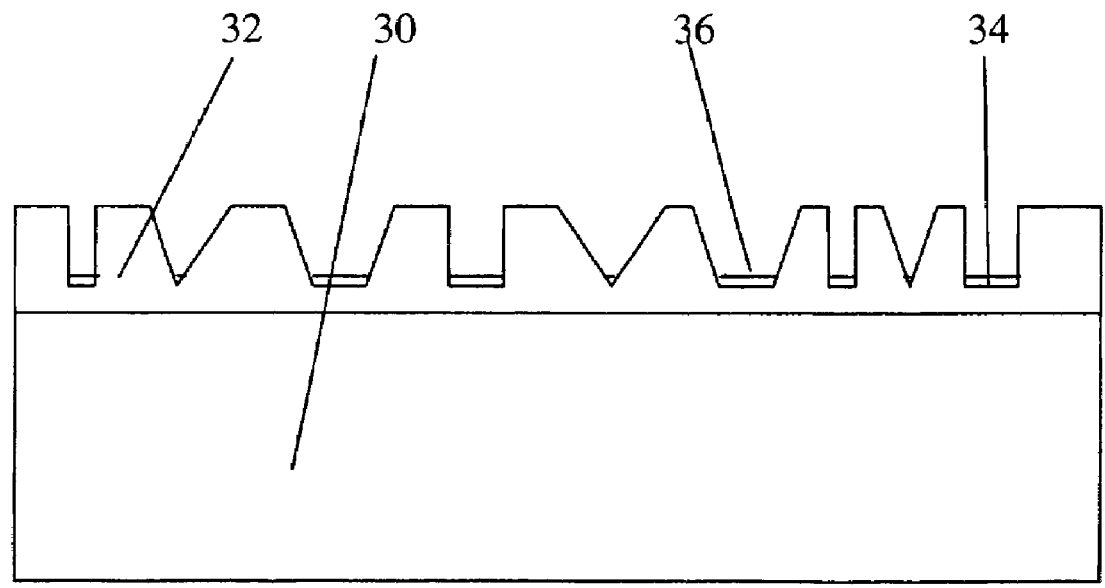
Figure 1:
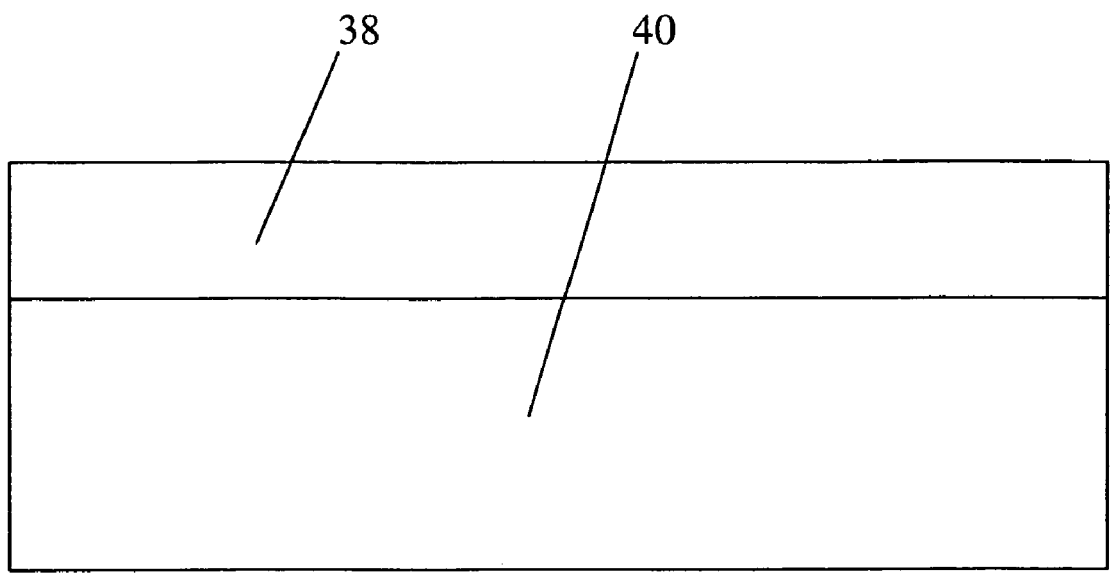
Figure 1:
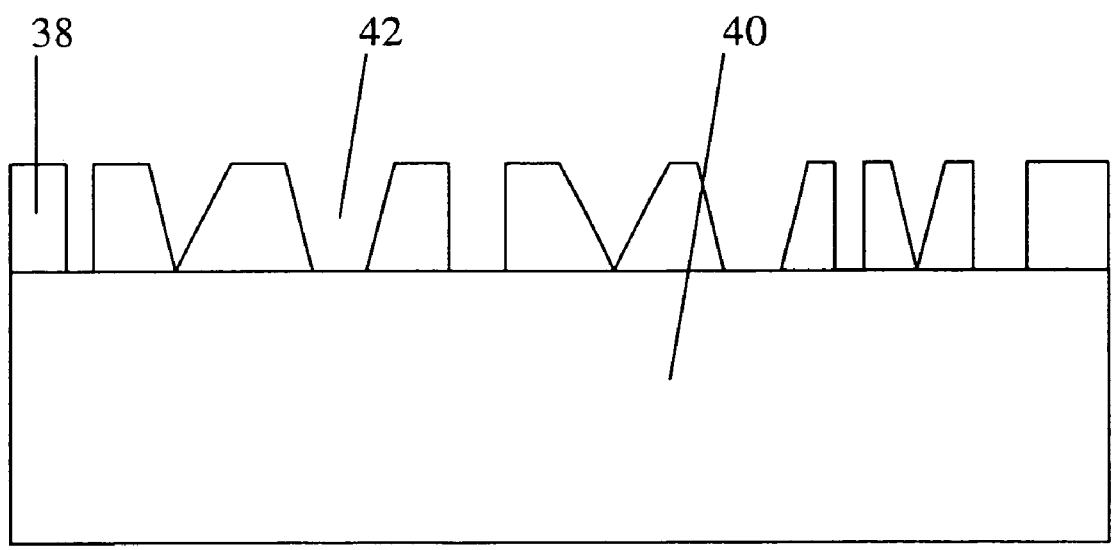
Figure 1:
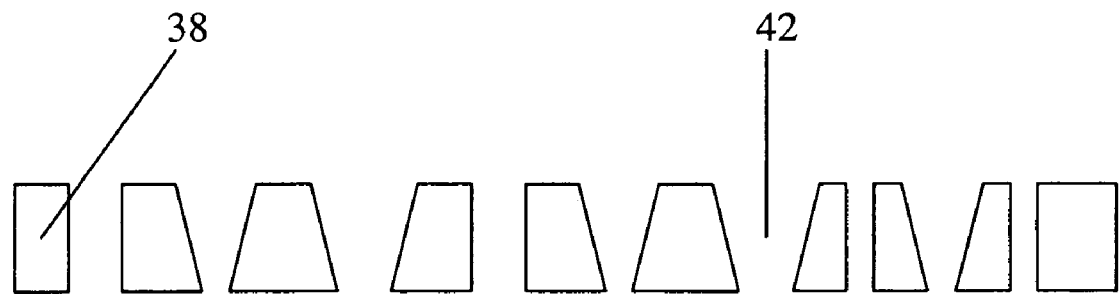
Figure 1:
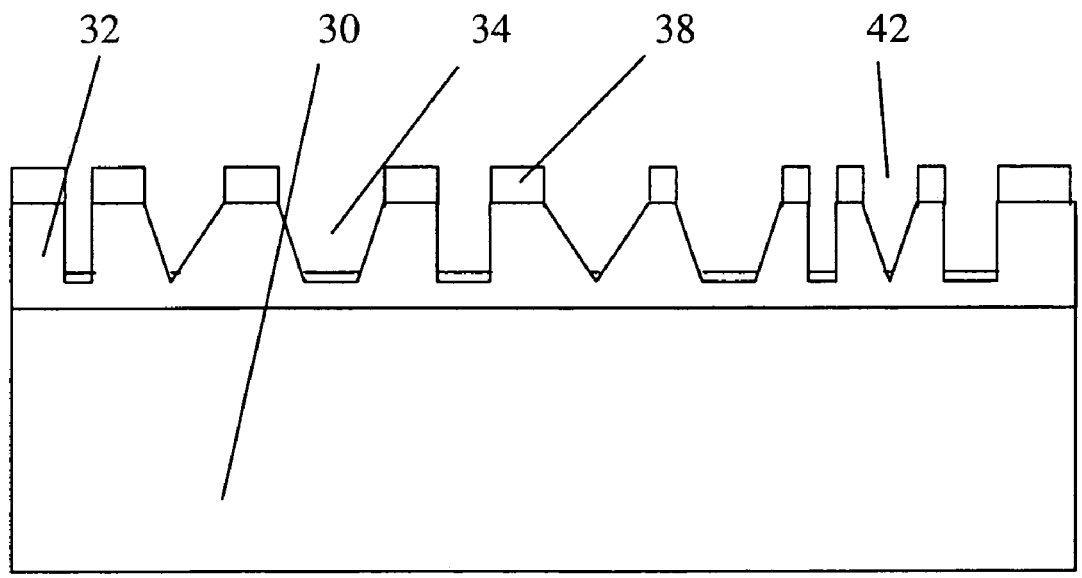
Figure 1:
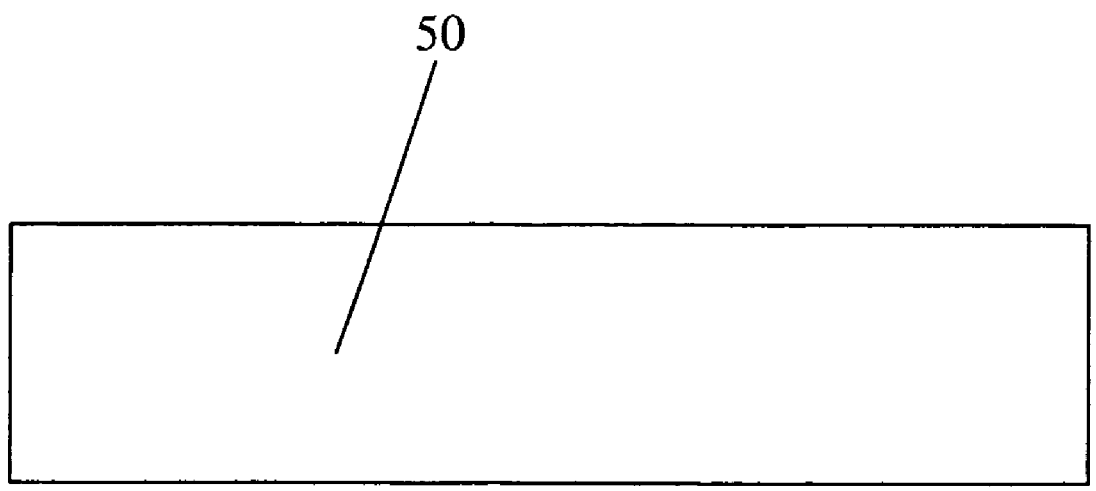
Figure 1:
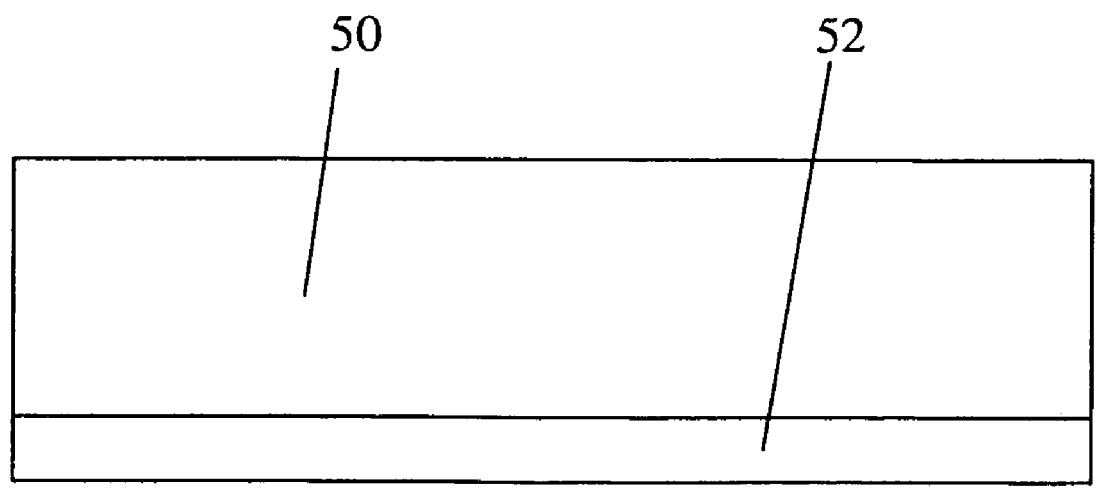
Figure 1:
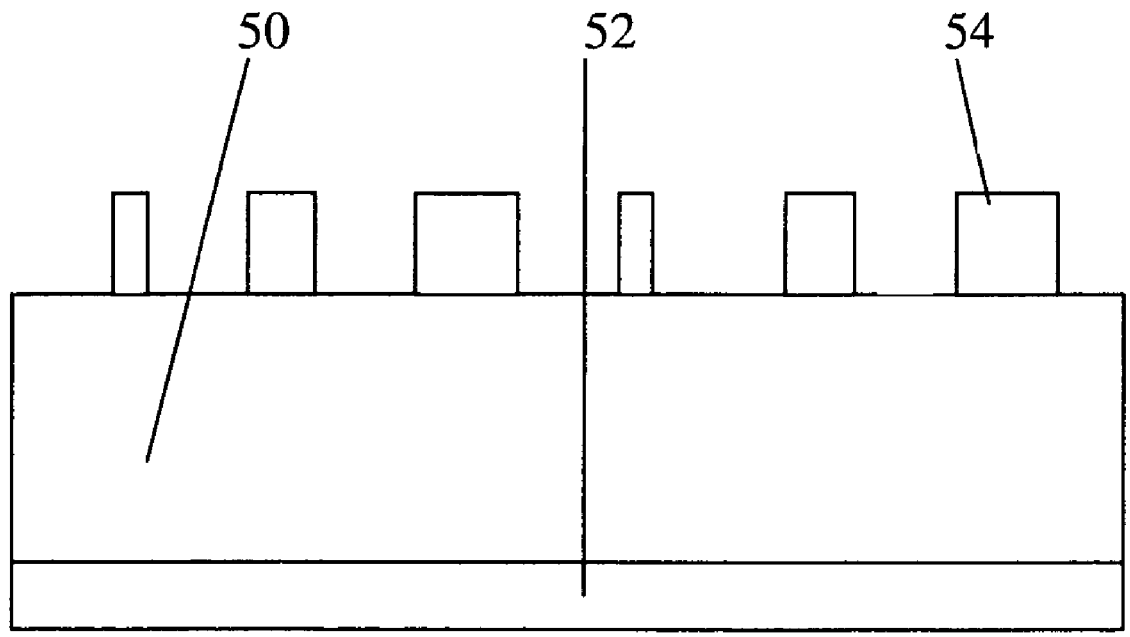
Figure 1:
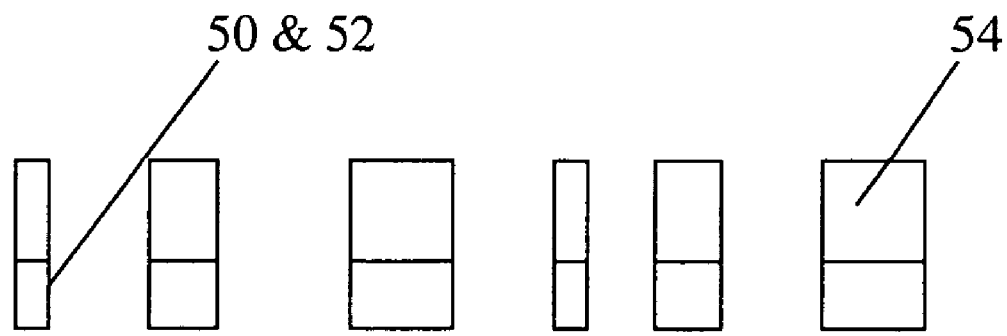

Referring first to the overall schematic cross-sectional view of FIG. 1, magnetic self assembly is achieved by conjunctive use of a magnetic and/or electric field. A plurality of microstructure devices 10 (also referred to herein as "pills"), each having a soft (i.e., unmagnetized or very low remanence) magnetic layer 12 at the bottom thereof are placed on top of a soft magnetic material guide layer 20 with exact patterned holes 22 which are shaped to mate in shape with the top openings of recesses 14 formed within an insulating layer 16 of a wafer 18 such as an epitaxial wafer. The latter can already have devices formed in it. A magnetized (hard) magnetic layer 15 is formed at the bottom of each patterned recess 14. The magnetized magnetic layer provides a predetermined magnetic field pattern.

In FIG. 1 a moving magnetic field is applied from a magnetic field source 24, which moves continuously in multiple lateral directions in the sense of the drawing so that individual device pills 10 can be moved about and fall through the holes in the guide layer 20 into recesses 14 and be retained therein due to the strong short-range or magnetic attractive force between the hard magnetic layer 15 in the recess and soft magnetic layer 12 on the device pill 10. Magnetic self-assembly is achievable with and without the guide layer 20. Magnetic self-assembly is facilitated by using a medium such as vacuum, air, or a low-viscosity, non-corrosive fluid in which the device pills are slurried. The moving magnetic field can e.g. be provided by the moving magnetic pole 26.

The magnetized hard magnetic layer 15 is formed at the bottom of each patterned recess 14 within the insulating layer of wafer 18 or at the bottom of each patterned recess 14 of the substrate. The magnetized hard magnetic layer provides a predetermined magnetic field pattern.

A number of patterned device microstructures or the like can be formed on another wafer wherein each device formed rests on a soft magnetic layer or non-magnetized magnetic layer. The plurality of such devices formed on the wafer can be etched from the wafer to form a plurality of device pills.

The magnetic field is applied so that individual device pills can be moved and fall through the holes in the guide layer 20 into recesses 14 and be retained therein due to the strong short-range magnetic attractive force between the hard magnetic layer in the recesses and soft magnetic layer at the device pill.

Magnetic self-assembly can also be achieved without using a guide layer with exact patterned holes, by simply placing the plurality of device pills over the surface of the recessed wafer or on an insulating layer. The plurality of device pills is preferably slurried using low-viscosity, non-corrosive fluids such as kerosene over the surface of the recessed wafer or on the insulating layer or soft magnetic or other guide layer. The magnetic self-assembly can also be achieved using air pressure as a facilitating medium. Further, mechanical vibrations can be used to assist magnetic self-assembly.

The sequence of steps used in the overall process of the invention can be further appreciated from the following:

In FIG. 1(*a*) a wafer 30 is shown, which in FIG. 1(*b*) is provided with an insulating layer 32. Patterned recesses 34 are then formed in the insulating layer 32 as shown in FIG. 1(*c*).

FIG. 1(*d*) a magnetized hard magnetic material layer 36 is provided at the bottom of the patterned recesses 34.

In FIG. 1(*e*) a soft magnetic material 38 is deposited on the top of a different wafer 40. In FIG. 1(*f*) patterned holes 42 are formed on the soft magnetic material 38 the shape of which should match the patterned recesses 34 formed in the insulating layer 32 on wafer 30.

In FIG. 1(*g*) the soft magnetic layer 38 with patterned holes 42 is separated from the wafer 40 by etching.

In FIG. 1(*h*) the soft magnetic layer 38 with patterned holes 42 is employed on the top of the patterned recesses 34 formed in the insulating layer 32 of FIG. 1(*c*), to provide an assembly as in FIG. 1.

In FIG. 1(*i*) an optoelectronic device manufacturing wafer 50 appears, such as a wafer of GaAs or GaN, etc. In FIG. 1(*j*) a soft magnetic material layer 52 is deposited on the backside of the optoelectronics devices manufacturing wafer 50. Devices 54 are then formed on the top of the optoelectronic devices manufacturing wafer 50, as in FIG. 1(*k*). In FIG. 1(*l*) devices 54 are separated from each other by sawing the optoelectronic device manufacturing wafer 50 where each device rest on a magnetic material. The same procedures are then used as in the sequences earlier discussed in FIG. 1(*i*) to 1(*l*).

Returning to FIG. 1, the magnetic field is applied at the backside of the wafer from the magnetic field source 24, which is continuously moving as to cover the entire portion of the backside of the wafer. This magnetic field applied on the backside of the wafer continuously moves the devices 10 on the top of the guide layer 20 with patterned holes 22. When a device comes near the patterned recesses, the exactly matching shape of the device with the shape of the patterned holes 22 in the magnetic guide layer 20, enables the device to pass through the holes 22 in the guide layer 20 and become attached to the bottom of the patterned recesses 14 formed in the insulating layer 16 on the wafer. This process continues until all the devices 10 are attached to the respective recesses in the insulating layer on the wafer, by virtue of the size and shape matching registry and the driving force of the magnetic field.

Where the patterned recess is formed in the magnetic material layer and the magnetic field applied, each recess acts like as crack, so that a north pole and south pole will form at the edge of the crack. The magnetic field exits the north pole and reenters at the south pole. The magnetic field spreads out when it encounter the small air gap created by the crack because the air cannot support as much magnetic field per unit volume as the magnet can. When the field spreads out, it appears to leak out of the material and, thus, it can be called a flux leakage field. When the devices with magnetic layer are sprinkled or placed on a magnetic layer with exact patterned holes on the top of the patterned recesses in the insulating layer on the wafer with devices in it or on the magnetic layer with exact patterned holes on the top of the patterned recesses in the substrate (insulator), the devices are attracted to the exact patterned holes in the magnetic layer and pass through the holes and become attached to the magnetic layer at the bottom of the patterned recesses in the wafer or substrate, and are retained there due to short range attractive force.

With reference to air pressure assisted magnetic self-assembly, applying air pressure (optimized) from all sides, can cause the devices (electronic or optoelectronic) to continuously move over the entire surface of the guide layer 20 or such pressure can be joined with the conjunctive use of an electric field across the magnetic layer. When the optoelectronic or electronic devices come to the vicinity of the patterned recesses they become attached to the bottom of the patterned recesses in the insulating layer because of the magnetic field. In this case air pressure also assists the magnetic field. With reference to vibration assisted magnetic self-assembly, the action is the same as above, except that vibration rather than air pressure causes the devices to move over the entire surface.

The direct method of the invention attaches a plurality of piece parts to a substrate, wherein each piece part is attached to a matching location on the substrate. The direct magnetic method described herein discloses an implementation of the magnetic self-assembly invention. The full scope of the invention itself allows for variability in the relationship between any individual piece part and any matching attachment site on the substrate.

The direct method does not rely on statistical randomness. Its desirable attributes, when compared to statistical assembly, are therefore scalability to rapid assembly of a plurality of piece part shapes on a substrate and avoidance of frustration effects that can lead to assembly errors. Frustration occurs if the path from one or more piece parts to a matching site on the substrate is blocked, or one or more sites on the substrate remain unoccupied owing to the path being blocked.

Figure 2:
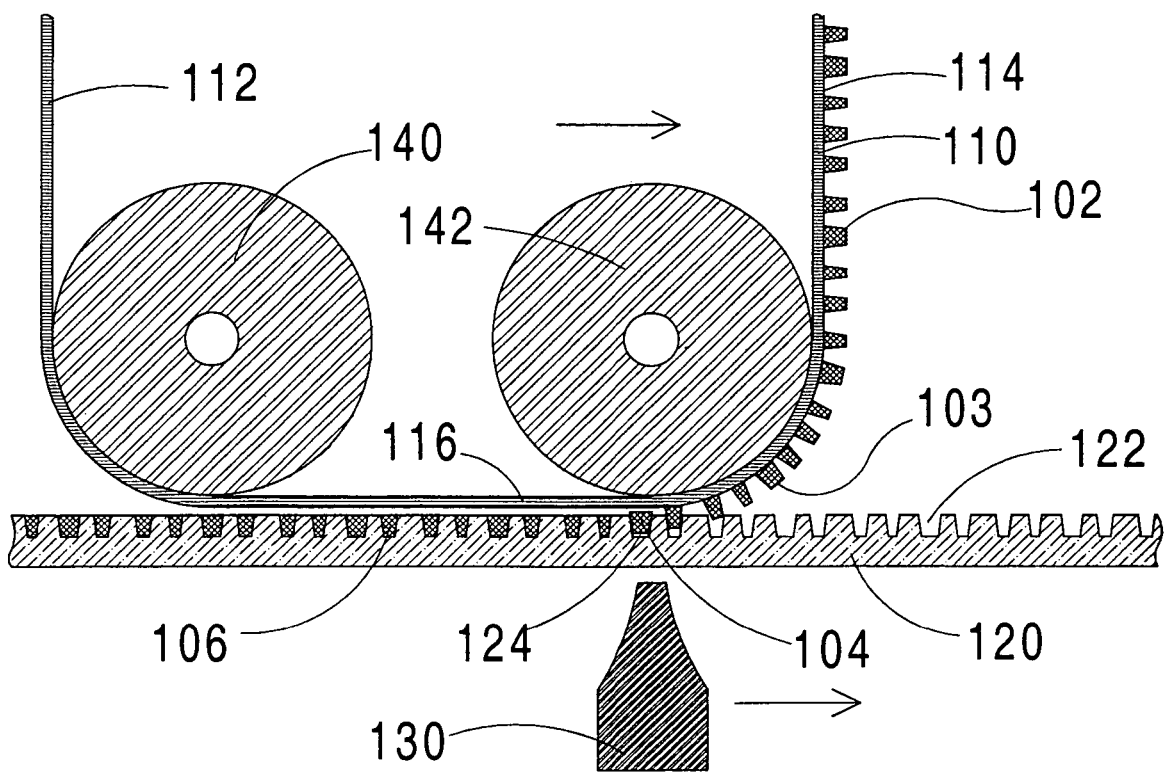
FIG. 2 is a cross-sectional schematic view of an exemplary apparatus operating in accordance with the invention.

A further embodiment of the invention is illustrated in the schematic view of FIG. 2.

In FIG. 2 a magnetically permeable substrate 120 the material of which can be a semiconductor, insulator or a metal that is magnetically permeable, is patterned with a plurality of recesses 122, that are shaped to receive a plurality of matching piece parts, such as exemplary piece parts 102, 104 and 106. Piece parts, such as piece part 102, are temporarily attached to feed tape portion 110. Upon completion of the magnetic self-assembly of a piece part, such as piece part 106, the part is attached to a matching recess on the substrate. Portions of feed tape are devoid of piece parts after assembly, such as at feed tape portion 116 parallel to the surface of the substrate, and feed tape portion 112 at an angle to the surface of the substrate.

Feed tape portions 110, 116, and 112 are guided by wheels 140 and 142. Magnet 130 moves adjacent to and relative to substrate 120 in a direction parallel to substrate 120. Equivalently, substrate 120 moves continuously relative to guide wheels. Feed tape portion 116 that is parallel to substrate 120 executes little or no relative motion in the direction parallel to substrate 120. Magnet 130 may execute continuous and/or oscillatory movement in any direction with respect to substrate 120.

Exposed faces of the piece parts on the feed tape, such as face 103, have coatings of a material with high magnetic permeability, such as an unmagnetized ferromagnetic material with low coercive field. The coating becomes magnetized when placed near an external magnet. The coating may also include a physical or chemical agent for subsequent permanent bonding of piece parts to the substrate. The magnetic field produced by moving magnet 130 magnetizes coating 103 and the ensuing magnetic force of attraction pulls the piece parts off the tape and into recesses in the substrate. Piece parts are pulled preferentially into recesses by several physical characteristics of the magnetic and contact forces. Firstly, the magnetic attractive force in the direction perpendicular to the surface of the substrate rapidly increases in strength as the distance between the piece part and the magnet decreases, that is, the magnetic attraction increases as the piece part moves into the matching recess. Secondly, the magnetic force component in the direction parallel to the surface of the substrate pulls the piece part laterally towards the recess. Thirdly, the piece parts and recesses are shaped so as to guide piece parts into matching recesses. An exemplary piece part 104, as illustrated schematically in FIG. 2, is in the process of being pulled from the spooling tape portion 116 into a particular recess 124 in substrate 120.

The feed tape is coated with a releasable adhesive on surface 114 to hold the piece parts in approximately commensurate relationships with matching recesses in the substrate. When magnet 130 is located adjacent to recess 124, as shown in FIG. 1, the magnetic field of the magnet 130 exerts an attractive force on piece part 104 that is sufficiently strong to overcome the relatively weaker force of adhesion between piece part 104 and feed tape portion 116. Previously attached piece parts, such as piece part 106, are retained in their respective recesses variously by thermally assisted compression bonding, that may also employ bond-coat films on the faces of the recesses.

Feed tape 110 is prepared by its being assembled with piece parts, such as piece part 102, after manufacture of the piece parts. The plurality of piece parts may be arranged in a two-dimensional pattern on feed tape 110 and a plurality of magnetic pole pieces comprising magnet 130 can be used to drive simultaneous assembly of a plurality of piece parts in the direct magnetic assembly process.

While the present invention has been described in terms of specific embodiments thereof, it will be understood in view of the present disclosure, that numerous variations upon the invention are now enabled to those skilled in the art, which variations yet reside within the scope of the present teaching. Accordingly, the invention is to be broadly construed, and limited only by the scope and spirit of the claims now appended hereto.

The invention claimed is:

1. A method for assembling and integrating microstructures (pills) onto a substrate, comprising:
    forming a plurality of patterned recesses on an insulating layer overlying said wafer, said recesses having transverse cross-sections and openings of specific shapes;
    depositing a hard magnetic layer at the bottom of each said recess;
    positioning a soft magnetic guide layer over said insulting layer, said guide having patterned hole shapes matching the shapes of the openings to said patterned recesses with which the holes mate; placing a collection of said pills atop said guide, said collection including members with cross-sections matching the shapes of the openings to said recesses, wherein each said pill is coated at one end with a soft magnetic layer; and
    applying from beneath the substrate an external continuously moving magnetic field to said collection of pills to agitate and move about the said pills, and effect a magnetic attraction between the said soft magnetic layers at the ends of said pills and the hard magnetic layer at the bottom of said recesses, said pills thereby being attracted to and falling through said similarly shaped guide holes and into the recesses and being firmly attracted to the bottoms of the recesses by the magnetic attractive forces, said pills thereby becoming attached to the hard magnetic layer at the bottom of the patterned recesses and being retained there.

2. A method for assembling and integrating microstructure pills onto a substrate, comprising;
    forming a plurality of patterned recesses in said substrate;
    providing a collection of said pills, each pill having a transverse cross section which mates with the shape of an opening in said substrate to a said recess, and each pill having at one end a coating of soft magnetic material;
    disposing the said pill collection to enable pill movement toward the said openings of said recesses; and
    drawing the pills into the recesses which mate therewith by applying from beneath the substrate an external continuously moving magnetic field; and wherein said pills are carried by a conveying belt to which they are lightly adhesive at their ends opposed to the ends coated with said soft magnetic material.

3. A method in accordance with claim 2, wherein said substrate is magnetically permeable and the magnetic field is applied from the side of said substrate non-adjacent said conveyor belt.

4. A method in accordance with claim 1, further including application of vibration for agitating said pills to facilitate their coinciding with said recess openings.

5. A method in accordance with claim 2, further including application of vibration for agitating said pills to facilitate their coinciding with said recess openings.

6. A method in accordance with claim 1, further including imposition of an air stream in order to agitate said pills to facilitate their coinciding with said recess openings.

7. A method in accordance with claim 2, further including imposition of an air stream in order to agitate said pills to facilitate their coinciding with said recess openings.

8. A method in accordance with claim 1, wherein said pills are dispersed in a liquid carrier to form a slurry, facilitating their agitation.

9. A method in accordance with claim 2, wherein said pills are dispersed in a liquid carrier to form a slurry, facilitating their agitation.

10. A method for assembling and integrating microstructures (pills) onto a substrate, comprising:

forming a plurality of patterned recesses on said substrate, said recesses having transverse cross-sections and openings of specific shapes;

depositing a hard magnetic layer at the bottom of each said recess;

placing a collection of said pills in overlying accessible relation to said substrate, said collection including members with cross-sections matching the shapes of the openings to said recesses, wherein each said pill is coated at one end with a soft magnetic layer; and applying from beneath said substrate an external continuously moving magnetic field to said collection of pills to agitate and move about the said pills, and effect a magnetic attraction between the said soft magnetic layers at the ends of said pills and the hard magnetic layer at the bottom of said recesses, said pills thereby being attracted to and falling into said similarly shaped holes and recesses and being firmly attracted to the bottoms of the recesses by the magnetic attractive forces, said pills thereby becoming attached to the hard magnetic layer at the bottom of the patterned recesses and being retained there.

* * * * *